United States Patent [19]
Nishimura

[11] Patent Number: 5,238,176
[45] Date of Patent: Aug. 24, 1993

[54] METHOD AND APPARATUS FOR FORMING BUMP

[75] Inventor: Hideo Nishimura, Shiga, Japan

[73] Assignee: International Business Machines Corporation, Armonk, N.Y.

[21] Appl. No.: 840,433

[22] Filed: Feb. 24, 1992

[30] Foreign Application Priority Data

May 31, 1991 [JP]   Japan .................................. 3-156122

[51] Int. Cl.[5] ............................................. B23K 31/02
[52] U.S. Cl. ..................................... 228/256; 228/33; 228/254; 118/410; 118/415; 427/123
[58] Field of Search ...................... 228/256, 180.2, 254, 228/39, 33; 118/410, 415; 427/123, 383.7

[56] References Cited

U.S. PATENT DOCUMENTS 3,603,286  9/1971  Scopp et al. ....................... 118/410
3,810,779  5/1974  Pickett et al. ...................... 118/410
5,133,120  7/1992  Kawakami et al. .................... 228/33

OTHER PUBLICATIONS

"Molten Solder Devices," *Research Disclosure*, Jun. 1988, No. 290.

Primary Examiner—Samuel M. Heinrich
Assistant Examiner—Jeffrey T. Knapp
Attorney, Agent, or Firm—Daniel P. Morris

[57] ABSTRACT

A bump having a shape adapted to bonding of a flip chip method and an enough volume is efficiently accurately formed at low costs. By applying a pressure into a chamber, a fused solder 8 in the chamber 1 is extruded from a micro opening 3 and adhered onto a pad 12. After that, by eliminating the pressure, the fused solder is separated by the surface tension of the fused solder itself and is allowed to remain as a solder bump onto the pad.

12 Claims, 4 Drawing Sheets ically formed at low costs is desirable.

METHOD AND APPARATUS FOR FORMING BUMP

FIELD OF THE INVENTION

The invention described herein relates to method and apparatus for forming a bump to fix a semiconductor chip onto a substrate.

Prior Art

A flip chip method whereby a semiconductor chip is attached to a substrate in a down face state and, at the same time, an electrical connection between the semiconductor chip and the substrate is also executed is known as a bonding method having a high mass productivity and a high connecting reliabiliuty.

When such a flip chip method is used, it is necessary to form a number of solder bumps each having uniform compositions and shape onto the semiconductor chip and the pad of the substrate. A method of efficiently forming such solder bumps with low costs is desirable.

Known methods of forming the solder bumps, there are: 1) a plating method whereby component ions of a solder are deposited onto a pad in an electrolyte by the electroplating principle; 2) an evaporation method whereby component atoms of the solder are evaporated in a vacuum and are deposited onto the pad; 3) a melt bonding method whereby a solder wire is melted and bonded onto the pad by using a method similar to a wire bonding method and is cut out after that, and the like. The above methods, however, don't satisfy the above requirements. In a method know as a dropping method a bump of uniform components can be efficiently formed at low costs by using a fused solder (JP-A-60-240142).

According to the dropping method, as shown in FIG. 6, a solder 63 is fused in a vessel 62 having a heater 61. The fused solder is dropped down from a nozzle 66 provided in the bottom of the vessel under the control by a piezoelectric element 64, and a solder bump 69 is formed onto a wiring substrate 68.

According to the dropping method, however, since a fused solder droplet is dropped from the nozzle onto the substrate, an acceleration is given to the fused solder droplet by gravity and a bump which is formed onto the substrate has a flat shape of a relatively large area.

When the number of pads which are to be connected increases due to the realization of a high integration degree, a condition such that the bump is formed onto the substrate by a micro area (that is, shape in which the bump has a relatively large height) while assuring a solder volume which is necessary for connection or that the bump is formed without protruding out of the pad is required in order to certainly connect and fix by the bump. According to the dropping method, however, it is difficult to satisfy the above requirement.

Using any of the above conventional methods, the bump which adequately satisfies the requirements in the flip chip method cannot be efficiently formed at low costs.

The present invention is made in consideration of the above conventional circumstances and it is an object of the invention to provide methods and apparatus for efficiently forming at low costs a bump which satisfies the conditions such that it is necessary to form the bump of uniform components and shape and that it is necessary to make a size of bump into a micro shape while having an enough volume in association with the realization of a high integration degree of a semiconductor chip, thereby solving the above problems of prior art methods.

SUMMARY OF THE INVENTION

To solve the above problems, in a bump forming method according to the present invention, a member having a microopening is arranged in a manner such that the microopening faces a pad on an object on which a bump is to be formed, a fused metal is extruded from the microopening and adhered onto the pad by pressurizing the fused metal, and the fused metal which has been extruded from the microopening and adhered onto the pad is separated by the surface tension of the fused metal itself by eliminating the pressure after that, thereby forming the bump. Together with the elimination of the pressure, by positively applying a negative pressure, the fused metal may be also sucked into the microopening. The negative pressure is not limited to a large value such as to positively suck the fused metal but may be set to a value such that it is possible to prevent that the fused metal drops from the micro opening in an ordinary state (state in which the bump forming operation is not performed).

Further practically speaking, a chamber having a microopening of a size corresponding to the bump to be formed in a bottom portion is arranged in a manner such that the microopening faces the pad on the object on which the bump is formed with a predetermined interval. By heating and fusing the metal such as a solder or the like enclosed in the chamber and by pressurizing the fused metal in the chamber, the fused metal is extruded from the microopening and adhered onto the pad. After that, by eliminating the pressure applied into the chamber, the fused metal which has been extruded form the micro opening the adhered onto the pad is separated from the fused metal in the chamber by the surface tension of the fused metal itself, thereby forming the bump.

In the invention, by using the fused metal (fused solder), the bump having uniform components is efficiently formed at low costs. After the fused metal extruded form the microopening was adhered onto the pad, the fused metal is separated by the surface tension of the fused metal itself, thereby forming the bump in a shape having a relatively large height.

When the invention is embodied, it is preferable that a pressure P which is applied to extrude the fused metal from the micro opening lies with in a range of $$4T/D1 > P > 2T(1/H2 + 1/(D1+H2))$$

where,

T: surface tension of the fused metal
D1: diameter of the microopening
H2: interval between the bottom surface on the outside of the chamber and the object The bump is formed without protruding out of the pad so long as the above condition is satisfied.

The above forming method is realized by a bump forming apparatus comprising: a chamber which has a microopening of a size corresponding to a bump to be formed in a bottom portion and which is arranged in a manner such that the microopening faces a pad on the object on which the bump is formed with a predetermined interval; heating means for heating and fusing metal enclosed in the chamber; pressure adjusting means for adjusting pressure in the chamber; and control means for controlling the pressure adjusting means in a manner such that the fused metal in the chamber is extruded from the microopening and adhered onto the pad by pressurizing the fused metal and the fused metal which has been extruded from the microopening and adhered onto the pad is separated from the fused metal in the chamber by a surface tension of the fused metal itself by eliminating the pressure applied into the chamber.

Figure 1:
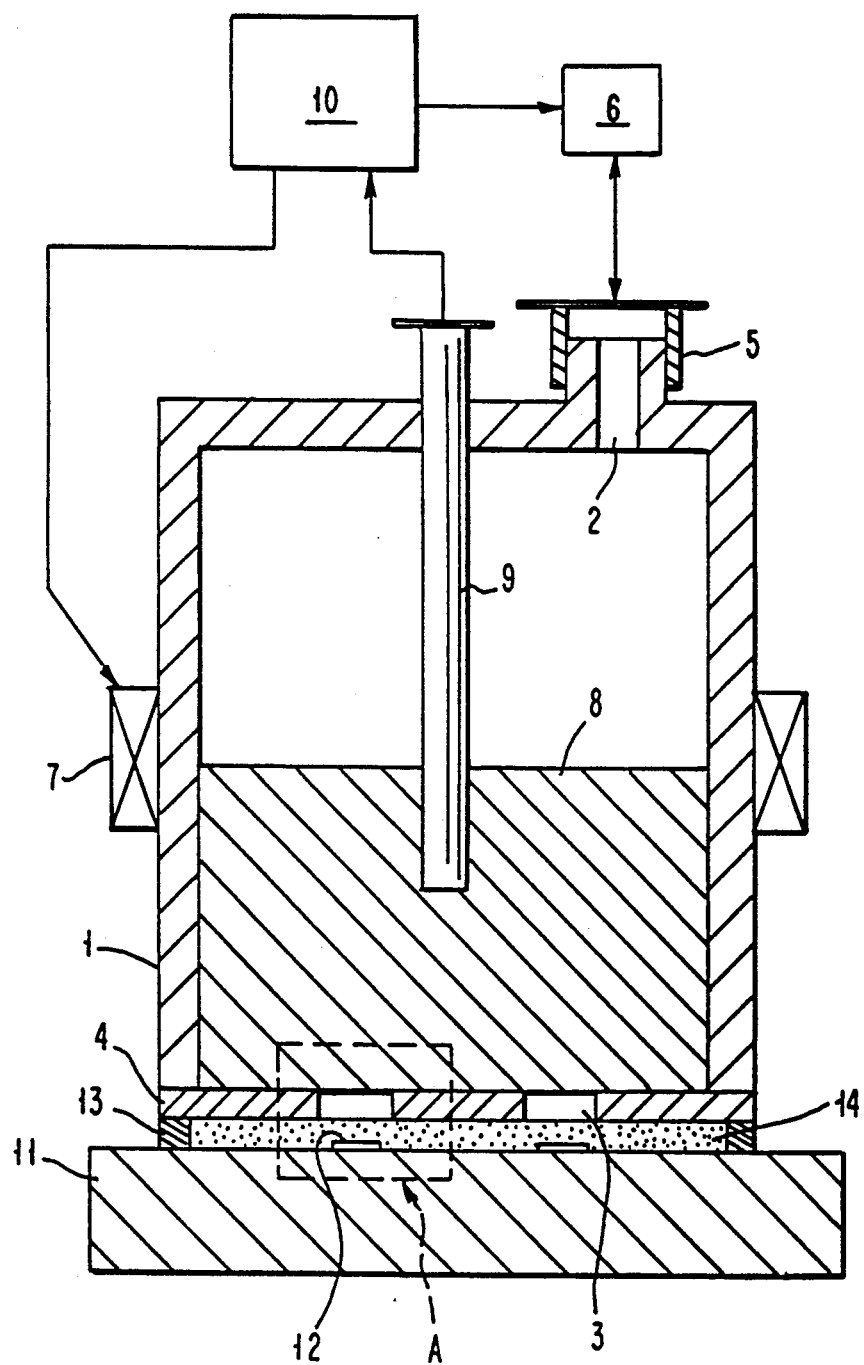
FIG. 1 is a cross sectional view of a bump forming apparatus according to an embodiment of the invention.

Explanation of Reference Numerals 1 chamber
3 micro opening
6 pressure adjusting means
7 heater
8 fused solder
10 control unit
11 substrate
12 pad
13 spacer

DETAILED DESCRIPTION

The invention will practically be described on the basis of an embodiment shown in the drawings.

FIG. 1 shows an example of an apparatus to form a solder bump. FIGS. 2 to 5 sequentially shown processing steps of forming a bump, while enlarging a portion A in FIG. 1.

The bump forming apparatus will be first explained.

A chamber 1 is made of a heat resistant material (such as, for example, aluminum, copper and stainless steel) which can endure a temperature which is equal to or higher than a melting point of a solder. The chamber 1 has a pressure passage 2 in an upper portion and a mask plate 4 formed with microopenings 3 in a bottom portion.

Pressure adjusting means 6 is connected to the pressure passage 2 through a conduit 5. The pressure adjusting means 6 has a pressure source and a changeover valve. The pressure in the chamber 1 can be pressurized by the pressure source or can be released into the atmosphere by the operation of the changeover valve.

The microopening 3 has a size corresponding to the solder bump to be formed. Although the number of microopenings 3 can be set to an arbitrary value, when the microopenings 3 of the same number as the number of pads 12 on a substrate 11 to form bumps are formed in a positional relation corresponding to those pads, all of the necessary bumps can be formed in a lump and such a method is more efficient.

A heater 7 as heating means is arranged around the chamber 1. The heater 7 can heat and fuse a solder 8 enclosed in the chamber 1.

A temperature sensing element 9 is inserted in the chamber 1. A temperature of the fused solder 8 is measured by the temperature sensing element 9.

The pressure adjusting means 6, heater 7, and temperature sensing element 9 are connected to a control unit 10. The pressure in the chamber 1 and the melting temperature of the solder 8 are controlled by the control unit 10.

Reference numeral 13 in FIG. 1 denotes a spacer to specify an interval between the substrate 11 and the mask plate 4. In the embodiment, the spacer 13 is attached to the mask plate 4. A spacer 13 which is separately prepared upon bump forming operation may be also interposed between the substrate 11 and the mask plate 4.

Reference numeral 14 in FIG. 1 denotes a flux which is coated onto the substrate 11 as necessary.

The formation of a solder bump 18 onto the pad 12 will now be described with reference to FIGS. 2 to 5.

The solder 8 enclosed in the chamber 1 is fused by heating with the heater 7.

Figure 2:
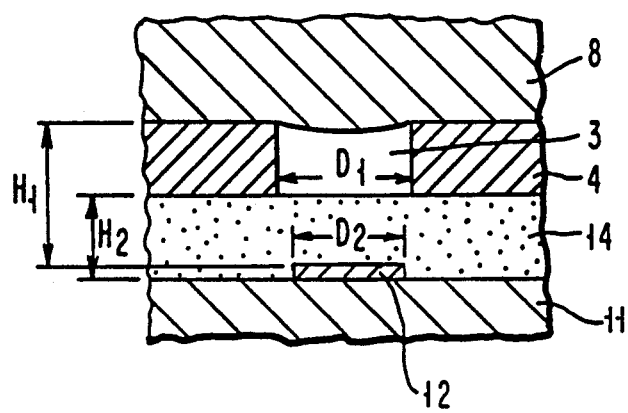
FIG. 2 is a enlarged diagram of an A portion in FIG. 1 for explaining a bump forming method according to an embodiment of the invention.

The pressure passage 2 is opened to the atmosphere by opening the valve of the pressure adjusting means 6 so as to escape the pressure in the chamber 1 which is generated by the heating from the pressure passage 2. Although the microopening 3 is exaggeratedly illustrated in the drawings, the microopening 3 has a size such that the fused solder 8 does not flow out in an ordinary state. The fused solder 8 is held in the chamber 1 as shown in FIG. 2.

On the other hand, the chamber 1 is mounted onto the substrate 11 with a predetermined interval which is specified by the spacer 13. The microopening 3 is positioned so as to face the pad 12.

The flux 14 which if necessary at this time is also coated. By coating the flux as mentioned above, the working steps can be simplified when the semiconductor chip is bonded later by a flip chip method.

In a state in which the inside of the chamber 1 is air-tightly held by closing the valve of the pressure adjusting means 6, a predetermined pressure P is applied from the pressure adjusting means 6 into the chamber 1 through the pressure passage 2.

Figure 3:
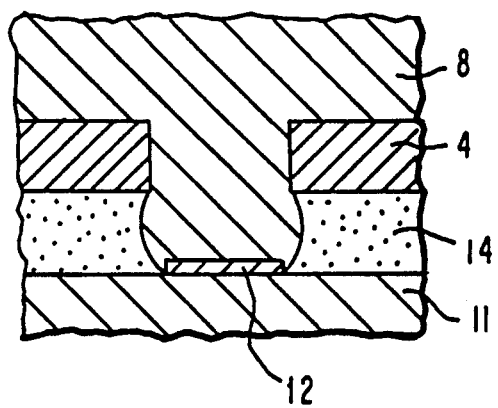
FIG. 3 is an enlarged diagram of the A portion in FIG. 1 for explaining a bump forming method according to the embodiment of the invention.

By supplying the pressure, the fused solder 8 in the chamber 1 is extruded from the microopening 3 and is adhered onto the pad 12. At this time, due to a balance between the extruding pressure P and the surface tension of the fused solder 8, the extruded fused solder 8 is adhered onto the pad 12 in a state in which it is expanded toward the side directions as shown in FIG. 3.

In this case of forming a bump to the pad (for example, copper, nickel, gold, etc.) having a wettability for the leader, it is sufficient to set the pressure P to a value in a range of $$4T/D1 < P < 2T(1/H2 + 1/(D1+H2))$$

where,

T: surface tension of the fused solder 8
D1: diameter of the micro opening 3 when it is formed as a circular hole
H2: interval between the bottom surface on the outside of the chamber 1 and the substrate 11 by the approximation based on the Laplace equation, that is, in a range between the pressure (left term) which is necessary to extrude the fused solder from the microopening against the surface tension and the pressure (right term) at which the fused solder keeps a spherical shape by the surface tension.

The supply of the pressure P is subsequently stopped by the pressure adjusting means 6 and the valve is opened to eliminate the pressure P, thereby reducing the pressure in the chamber 1 and setting into the atmospheric pressure.

Figure 4:
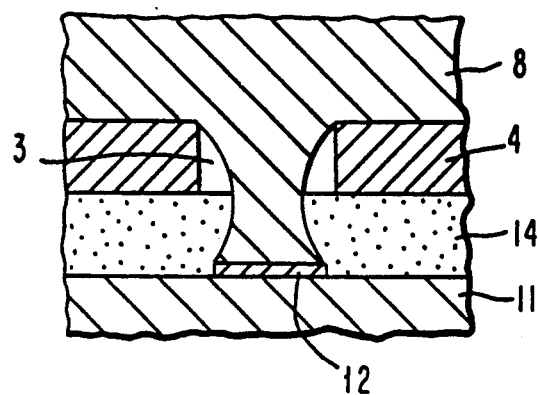
FIG. 4 is an enlarged diagram of the A portion in FIG. 1 for explaining the bump forming method according to the embodiment of the invention.
Figure 5:
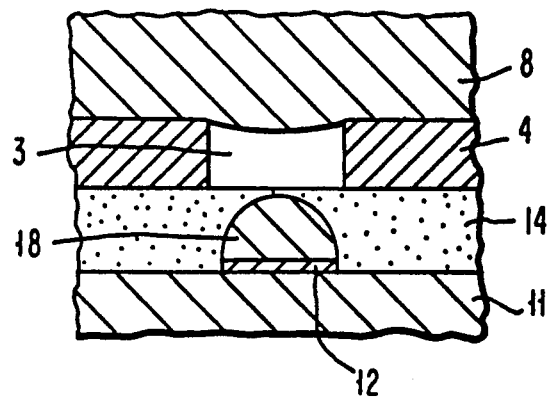
FIG. 5 is an enlarged diagram of the A portion in FIG. 1 for explaining the bump forming method according to the embodiment of the invention.
Figure 6:
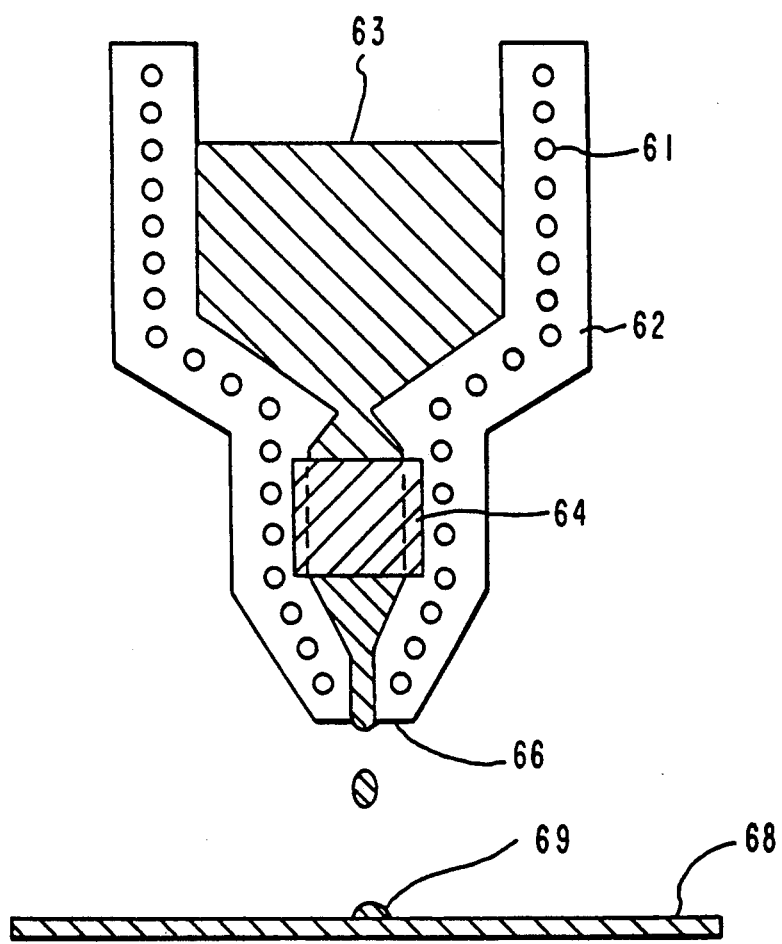
FIG. 6 is a cross sectional view of a conventional bump forming apparatus.

Thus, the fused solder 8 adhered on the pad 12 is returned into the chamber 1 by the surface tension of the fused solder itself and its shape is converged as shown in FIG. 4. Finally, it is separated as shown in FIG. 5 and forms the hemispherical solder bump 18 onto the pad 12.

A volume V of the bump 18 formed is approximated by $$V = K(D1, D2)\{/12 \times H1D23/(D1+D2)\}$$

where,
H1: interval between the bottom surface on the inside of the chamber 1 and the pad 12
D1: diameter of the microopening 3 when it is formed like a circular hole
D2: diameter of the pad 12 when it is formed like a circular shape
K(D1, D2): correction constant by D1 and D2

The volume V can be controlled by H1, D1, and D2. By adhering the fused solder 8 onto the pad 12 and separating the stripe-shaped fused solder, the bump is formed. Therefore, the bump is accurately positioned onto the pad 12 which faces the microopening 3. As compared with the case of dropping, a force to extend the bump to the side directions is not excessively applied to the fused solder. The bump 18 is formed in a shape adapted to the bonding by the flip chip method.

Under the condition in which the solder 8 comprising lead and tin of a weight ratio of 63:37 is fused at temperatures within a range from 200° C. to 230° C., the following parameters which are important when the bumps are formed according to the invention are set into the following practically preferable ranges.

The diameter D1 of the microopening 3 . . .
(D1: 0.06 mm–0.2 mm)
The diameter D2 of the pad 12 . . .
(D2: 0.1 mm–0.2 mm)
The interval H1 between the bottom surface on the inside of the chamber 1 and the pad 12 . . .
(H1: 0.05 mm–0.2 mm)
The interval H2 between the bottom surface on the outside of the chamber 1 and the substrate 11 . . .
(H2: 0.015 mm–0.025 mm)
The pressure P which is applied to extrude the fused solder 8 from the microopening 3 (as a difference from the atmospheric pressure) . . .
(P: 0.24 kgf/cm2–0.3 kgf/cm2)

In the embodiment, the bump is formed by the solder. The invention, however, can be also applied to the case of forming the bump by another metal. As an object, the invention can be also applied to the case of forming a bump to the pad on the semiconductor chip side. When the fused metal is separated, the invention is not limited to the method whereby the pressure is eliminated and the atmospheric pressure state is set but it is also possible to construct in a manner such that the inside of the chamber is positively set into a negative pressure state and the fused metal 8 is sucked into the microopening 3. By using the above method, the fused metal can be certainly separated without strictly setting the foregoing interval H1 and the like. Further, the negative pressure is not necessarily set to a large value such as to provide the foregoing operation. It is possible to prevent the drop of the fused metal by such a negative pressure.

Effects of the Invention

According to the invention, the micro bump having uniform components and an enough volume which is extremely accurately positioned onto the pad can be efficiently formed onto the pad at low costs. The shape of the bump formed as mentioned above is suitable to the bonding of the flip chip method. The reliability of the bonding between the semiconductor chip and the substrate can be improved.

What is claimed is:

1. A method of forming a bump for fixing a semiconductor chip onto a substrate, comprising the steps of:
    arranging a chamber having a microopening of a size corresponding to the bump to be formed in a bottom portion in a manner such that the microopening faces a pad on an object on which the bump is formed so as to form a predetermined gap;
    heating and fusing a metal enclosed in said chamber;
    extruding the fused metal in the chamber from the microopening by pressurizing the fused metal to thereby adhere the fused metal onto the pad;
    thereafter, separating the fused metal which has been extruded from the microopening and adhered onto the pad from the fused metal in the chamber by a surface tension of the fused metal itself by eliminating the pressure applied into the chamber;
    thereby forming the bump; and
    a pressure P is applied to extrude the fused metal from said microopening lies within a range of $$4T/D1 < P < 2T(1/H2 + 1/(D1+H2))$$

where,
    T: surface tension of the fused metal
    D1: diameter of said microopening
    H2: interval between the bottom surface of the outside of the chamber and the object.

2. A bump forming method according to claim 1, wherein after the fused metal has been extruded from the microopening and adhered onto the pad by pressurizing the fused metal, by eliminating said pressure and applying a negative pressure, the fused metal is sucked into the microopening, the fused metal which has been extruded from the microopening and adhered onto the pad is separated by the surface tension of the fused metal itself, and the bump is formed.

3. An apparatus for depositing a bump of material on a surface comprising:
    a chamber for containing said material;
    said chamber has at least one orifice;
    means for disposing said at least one orifice at a predetermined distance from said substrate;
    means for placing said material in a flowable state;
    means for applying pressure to said material in a flowable state to force said material in a flowable state out said at least one orifice onto said surface;
    means for adjusting said pressure to control the amount of said material in a flowable state which is deposited on said substrate;

said means for disposing said at least one orifice at a predetermined distance from substrate is a spacer between said substrate and a surface of said chamber containing said orifice.

4. The apparatus of claim 3, wherein said means for placing said material in a flowable state is a heating means.

5. The apparatus of claim 3, wherein said material is solder.

6. The apparatus of claim 3, wherein said means for adjusting said pressure comprises a means for applying a positive pressure to force said material in a flowable state out of said orifice onto said substrate and a means for applying a negative pressure to withdraw back into said orifice said material in a flowable state so that surface tension of said flowable material layer causes a break in said material layer leaving a bump of said material on said substrate.

7. The apparatus of claim 6, wherein said positive pressure P lies with a range of:

$$4T/D1 > P > 2T(1/H2 + 1/(D1+H2))$$

where,
T is said surface tension of said flowable material
D1 is the dimension of said orifice
H2 is said predetermined distance.

8. The apparatus of claim 3, wherein there are a plurality of orifices at an exterior surface of said chamber.

9. The apparatus of claim 12, wherein said plurality of orifices are in a pattern for alignment with a corresponding pattern of locations on said surface.

10. The apparatus of claim 8, wherein said material is a solder and wherein said pattern of locations are solder wettable to permit mounds of solder to be disposed on said substrate on said solder wettable patterns.

11. The apparatus of claim 10, wherein said substrate is a semiconductor chip.

12. The apparatus of claim 10, wherein said substrate is a semiconductor chip packaging substrate.

* * * * *